US009048898B2

(12) United States Patent
Han et al.

(10) Patent No.: US 9,048,898 B2
(45) Date of Patent: Jun. 2, 2015

(54) FRONT END MODULE

(71) Applicant: SAMSUNG ELECTRO-MECHANICS CO., LTD., Suwon, Gyunggi-do (KR)

(72) Inventors: Myeong Woo Han, Gyunggi-do (KR); Youn Suk Kim, Gyunggi-do (KR); Shinichi Iizuka, Gyunggi-do (KR); Ju Young Park, Gyunggi-do (KR); Ki Joong Kim, Gyunggi-do (KR); Young Jean Song, Gyunggi-do (KR); Jun Goo Won, Gyunggi-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 20 days.

(21) Appl. No.: 13/770,884

(22) Filed: Feb. 19, 2013

(65) Prior Publication Data

US 2014/0162579 A1 Jun. 12, 2014

(30) Foreign Application Priority Data

Dec. 10, 2012 (KR) .......................... 10-2012-0142922

(51) Int. Cl.
| | | |
|---|---|---|
| H04B 1/04 | (2006.01) | |
| H03H 7/46 | (2006.01) | |
| H03H 7/38 | (2006.01) | |
| H03F 1/56 | (2006.01) | |

(52) U.S. Cl.
CPC ................ *H04B 1/0458* (2013.01); *H03H 7/46* (2013.01); *H03H 7/468* (2013.01); *H03H 7/38* (2013.01); *H03F 2200/387* (2013.01); *H03F 1/56* (2013.01); *H03H 2007/386* (2013.01); *H03F 2203/21139* (2013.01)

(58) Field of Classification Search
CPC ................ H03F 1/56; H03F 2200/387; H03F 2203/21139; H03H 7/38; H03H 7/46; H03H 7/468; H03H 2007/386
USPC ....................... 455/120, 121, 123, 125, 78, 83
See application file for complete search history.

(56) References Cited

U.S. PATENT DOCUMENTS 5,159,297 A * 10/1992 Tateno ........................... 333/104
5,477,184 A * 12/1995 Uda et al. ...................... 327/404
7,511,592 B2 * 3/2009 Inoue ............................ 333/104

(Continued)

FOREIGN PATENT DOCUMENTS

KR 2004-0062711 A 7/2004
KR 10-0763994 B1 10/2007

(Continued)

OTHER PUBLICATIONS

Notice of Office Action Korean Patent Application No. 10-2012-0142922 dated Jan. 23, 2014 with English translation.

*Primary Examiner* — Duc M Nguyen
(74) *Attorney, Agent, or Firm* — McDermott Will & Emery LLP

(57) ABSTRACT

There is provided a front end module, including an amplification circuit unit amplifying signal, a multistage matching circuit unit connected to an output terminal of the amplification circuit unit, and a switch circuit unit connected to the multistage matching circuit unit, wherein the switch circuit unit includes a series switch circuit and a parallel switch circuit, the parallel switch circuit being connected to a node between a plurality of matching circuits included in the multistage matching circuit unit.

9 Claims, 3 Drawing Sheets

(56) References Cited

U.S. PATENT DOCUMENTS

| | | | |
|---|---|---|---|
| 8,536,636 B2* | 9/2013 | Englekirk | 257/303 |
| 8,559,907 B2* | 10/2013 | Burgener et al. | 455/333 |
| 8,583,111 B2* | 11/2013 | Burgener et al. | 455/433 |
| 2005/0099227 A1 | 5/2005 | Kim et al. | |
| 2006/0194567 A1* | 8/2006 | Kelly et al. | 455/408 |
| 2007/0018758 A1* | 1/2007 | Fukuda et al. | 333/263 |
| 2007/0024389 A1* | 2/2007 | Mizutani | 333/104 |
| 2007/0218844 A1* | 9/2007 | Alanen et al. | 455/73 |
| 2008/0136729 A1* | 6/2008 | Kang et al. | 343/861 |
| 2008/0150630 A1* | 6/2008 | Fukuda et al. | 330/53 |
| 2008/0278260 A1* | 11/2008 | Fukuda et al. | 333/32 |
| 2010/0194487 A1 | 8/2010 | Fukuda et al. | |
| 2011/0316636 A1* | 12/2011 | Zhao et al. | 330/310 |
| 2012/0252384 A1* | 10/2012 | Burgener et al. | 455/127.1 |
| 2014/0104132 A1* | 4/2014 | Bakalski et al. | 343/861 |

FOREIGN PATENT DOCUMENTS

| | | |
|---|---|---|
| KR | 10-2008-0104380 A | 12/2008 |
| KR | 10-2010-0088534 | 8/2010 |

* cited by examiner

FRONT END MODULE

CROSS-REFERENCE TO RELATED APPLICATIONS

This application claims the priority of Korean Patent Application No. 10-2012-0142922 filed on Dec. 10, 2012, in the Korean Intellectual Property Office, the disclosure of which is incorporated herein by reference.

BACKGROUND OF THE INVENTION

1. Field of the Invention

The present invention relates to a front end module capable of significantly reducing a leakage voltage that may be generated in a signal transmission mode while constituting a parallel switch circuit having a relatively reduced number of switch devices, and thus preventing a deterioration of linearity and breakage of elements, by disposing a parallel switch circuit between a node included in a matching circuit unit and a ground node.

2. Description of the Related Art

A front end module (FEM) is a module of a mobile device or the like, in which high-frequency components, such as a SAW filter, a diplexer, a low pass filter, an RF switch, and the like, are integrated into a single module to significantly reduce an area occupied thereby, and is a necessary component in an electronic device having a communications function. In particular, a front end module employed in a mobile device may serve as a filter for separating a transmission signal and a reception signal to prevent signal collision and selectively pass only signals having a particular frequency.

Generally, a single chip front end module applied to the mobile device includes an amplification circuit unit amplifying a signal, a switch circuit unit transmitting an output signal of the amplification circuit unit to an antenna, and the like. The switch circuit unit is controlled to be turned on or off depending on the operation mode (a signal transmission mode or a signal reception mode) of the front end module, and a serial switch circuit unit and a parallel switch circuit unit may be disposed between an output terminal of the amplification circuit unit and the antenna and between the output terminal of the amplification circuit unit and a ground terminal, respectively.

When the switch circuit unit is turned on, a voltage is barely applied to switch devices constituting the switch circuit unit, and thus linearity of the switch devices barely influences an operation of the entire circuit of the front end module. On the contrary, when the switch circuit unit is turned off, a predetermined voltage is applied to the respective switch devices. Since the voltage at which one switch device may withstand is fixed, the switch circuit unit is required to be configured in a stack structure in which several switch devices are connected, in order to improve stability of the entire circuit. As such, when the amount of switch devices included in the switch circuit unit is increased, linearity characteristics and withstand voltage may be improved, but the size of the module may be increased and the price thereof may be increased.

In the Related Art Documents below, Patent Document 1 is directed to a multiband matching circuit and an amplification circuit, and discloses a multiband amplification circuit including an amplification circuit and a matching circuit, and Patent Document 2 is directed to a high-efficiency multimode power amplification device, and discloses an amplification circuit including an impedance matching circuit and an amplification circuit. However, Patent Documents 1 and 2 fail to disclose a method for decreasing the amount of switch devices included in a switch circuit unit by changing the configuration in which an output terminal of the amplification circuit is connected with the switch circuit unit.

RELATED ART DOCUMENTS (Patent Document 1) Korean Patent Laid-Open Publication No. 10-2010-0088534
(Patent Document 2) Korean Patent Laid-Open Publication No. 10-2004-0062711

SUMMARY OF THE INVENTION

An aspect of the present invention provides a front end module in which a parallel switch circuit unit having a stack structure is connected to a node between multistage matching circuit units connected to an output terminal of an amplification circuit unit. Therefore, in the case in which a series switch circuit unit connected between an end node of the multistage matching circuit unit and an antenna is turned on and the parallel switch circuit unit is turned off, a signal having a relatively low level is transmitted to the parallel switch circuit unit, whereby the amount of switch devices included in the parallel switch circuit unit may be decreased.

According to an aspect of the present invention, there is provided a front end module, including: an amplification circuit unit amplifying signal; a multistage matching circuit unit connected to an output terminal of the amplification circuit unit; and a switch circuit unit connected to the multistage matching circuit unit, wherein the switch circuit unit includes a series switch circuit and a parallel switch circuit, the parallel switch circuit being connected to a node between a plurality of matching circuits included in the multistage matching circuit unit.

The series switch circuit and the parallel switch circuit may each include a plurality of switch devices.

The amount of switch devices included in the series switch circuit may be greater than the amount of switch devices included in the parallel switch circuit.

The plurality of switch devices included in the parallel switch circuit may be connected to one another to form a stack structure.

Here, when the series switch circuit is turned on, the switch circuit unit may turn off the parallel switch circuit to transmit a signal amplified by the amplification circuit unit to an output terminal.

According to another aspect of the present invention, there is provided a front end module, including: an amplification device having an input terminal and an output terminal; a plurality of matching circuits connected to an output terminal of the amplification device; a plurality of first switch devices connected in parallel between the plurality of matching circuits; and a plurality of second switch devices connected in series between an end terminal of the plurality of matching circuits and an antenna, wherein the amount of the plurality of the first switch devices is lower than the amount of the plurality of the second switch devices.

The plurality of matching circuits may each include at least one capacitive element and at least one inductive element.

The plurality of first switch devices may be connected in series between a node between the plurality of matching circuit and a ground terminal, and the plurality of second switch devices may be connected in series between an end node of the plurality of matching circuits and the antenna.

Here, when the plurality of second switch devices are turned on, the plurality of first switch devices may be turned off.

The plurality of first switch devices may have a stack structure in which a leakage voltage transmitted to the plurality of first switch devices is significantly reducible, in a signal transmission mode in which the plurality of second switch devices are turned on to transmit an output signal of the amplification device to the antenna.

The plurality of first switch devices and the plurality of second switch devices may include a plurality of MOSFETs, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In addition, in each embodiment of the present invention, since a structure, a shape, a numerical value described by way of example are only examples provided in order to assist in the understanding of technical features of the present invention, they are not limited to these examples, but may be variously changed within the spirit and the scope of the present invention.

Figure 1:
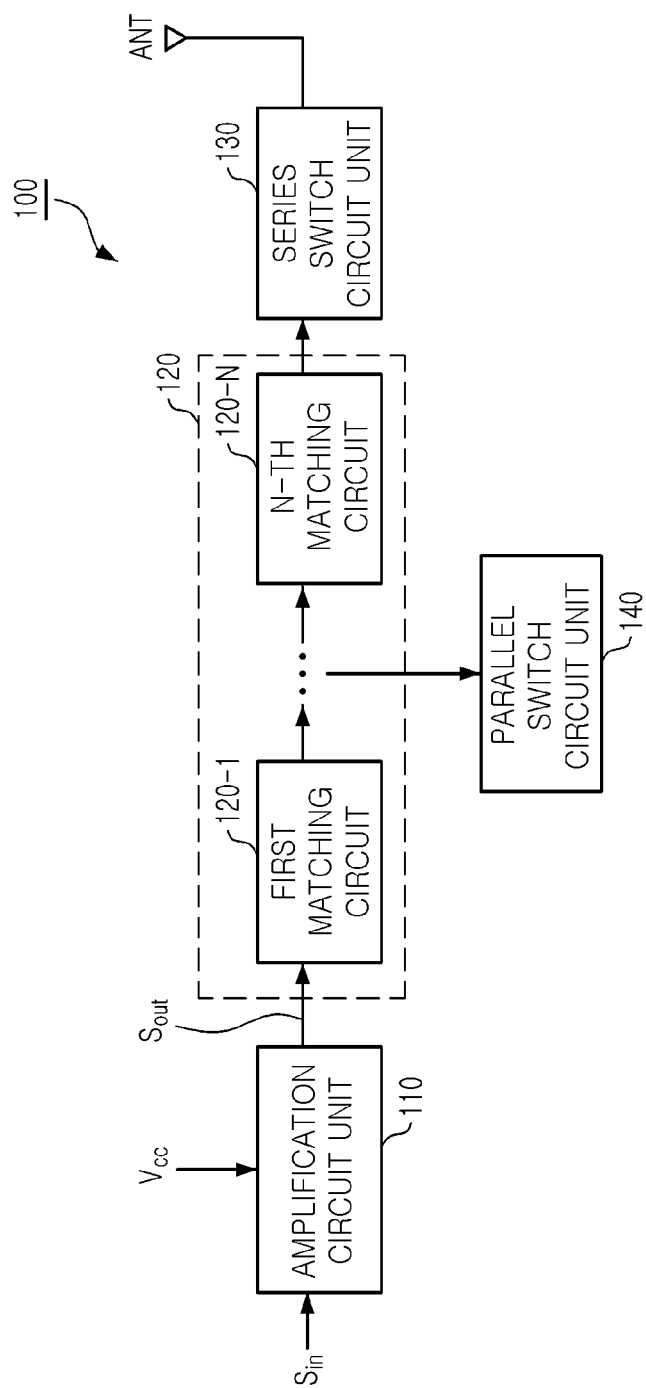
FIG. 1 is a block diagram schematically showing a front end module according to an embodiment of the present invention.

FIG. 1 is a block diagram schematically showing a front end module according to an embodiment of the present invention.

Referring to FIG. 1, a front end module 100 according to the present embodiment may include an amplification circuit unit 110, a multistage matching circuit unit 120 including a plurality of matching circuits 120-1 to 120-N, a series switch circuit unit 130, and a parallel switch circuit unit 140. One side of the series switch circuit unit 130 may be connected to antenna ANT.

The amplification circuit unit 110 may amplify a predetermined input signal $S_{in}$ to generate an output signal $S_{out}$, and include at least one amplification device for amplification. The amplification device included in the amplification circuit unit 110 may be implemented by a transistor, and the multistage matching circuit unit 120 may be connected to a node of the amplification circuit unit, through which the output signal $S_{out}$ is outputted.

The multistage matching circuit unit 120 may include a plurality of matching circuits 120-1 to 120-N. In order to allow the amplification circuit unit 110 to obtain a relatively maximum power of output, an output impedance of the amplification device included in the amplification circuit unit 110 may be several ohms. Whereas, an input impedance of a switch device included in the series switch circuit unit 130 transmitting the output signal $S_{out}$ of the amplification circuit unit 110 to the antenna ANT may be several tens of ohms (for example, 50Ω), higher than the output impedance of the amplification device. The multistage matching circuit unit 120 may be disposed between an output terminal of the amplification circuit unit 110 and the series switch circuit unit 130, for impedance conversion to compensate for this impedance mismatch.

When the series switch circuit unit 130 is turned-on, the output signal $S_{out}$ of the amplification circuit unit 110 is transmitted to the antenna ANT, passing through the multistage matching circuit unit 120 and the series switch circuit unit 130. Since the series switch circuit unit 130 is operated when a plurality of switch devices included in the series switch circuit unit 130 are all turned on, voltage is barely applied to the plurality of switch devices included in the series switch circuit unit 130, and thus a deterioration of linearity due to the operation of the series switch circuit unit 130 may not arise.

On the other hand, since the parallel switch circuit unit 140 is turned off in a signal transmission mode in which the series switch circuit unit 130 is turned on, a deterioration of linearity may arise. That is, a voltage generated at a middle node of the multistage matching circuit unit 120, as a leakage signal, is applied to the switch devices included in the parallel switch circuit unit 140 that has been turned off. In the case in which the level of the leakage signal is excessively large, overall linearity may be deteriorated or the switch devices included in the parallel switch circuit unit 140 may be damaged. Therefore, the plurality of switch devices included in the parallel switch circuit unit 140 are connected to one another in a stack structure, so that deterioration of linearity and damage to switch devices may be prevented.

Considering that defects or faults such as damage to switch devices and deteriorations of linearity occur depending on the level of a leakage signal transmitted to the parallel switch circuit unit 140 in a signal transmission mode, the defects or faults as described above may be solved by lowering the level of a leakage signal flowing into the parallel switch circuit unit 140. Therefore, in the present embodiment, the parallel switch circuit unit 140 is connected to the middle node through which the plurality of matching circuits 120-1 to 120-N included in the multistage matching circuit unit 120 are connected to one another.

Due to the characteristics of the multistage matching circuit unit 120 performing impedance conversion, as the output signal $S_{out}$ of the amplification circuit unit 110 passes through the plurality of matching circuits 120-1 to 120-N, the level thereof increases. That is, the level of an output signal of a first matching circuit 120-1 is lower than the level of an output signal of an n-th matching circuit 120-N. Therefore, in the present embodiment, the level of a leakage signal flowing into the parallel switch circuit unit 140 may be lowered by connecting the parallel switch circuit unit 140 to the middle node of the multistage matching circuit unit 120, not to the final end node thereof.

Lowering the level of leakage signal flowing into the parallel switch circuit unit 140 may be helpful in reducing configuration costs of the overall circuit and decreasing the area of a chip constituting the front end module. Since the level of the leakage signal flowing into the parallel switch circuit unit 140 is relatively small, the relatively small number of switch devices may constitute the parallel switch circuit unit 140 and thus the configuration costs of the circuit and the area of the chip may be lowered.

Figure 2:
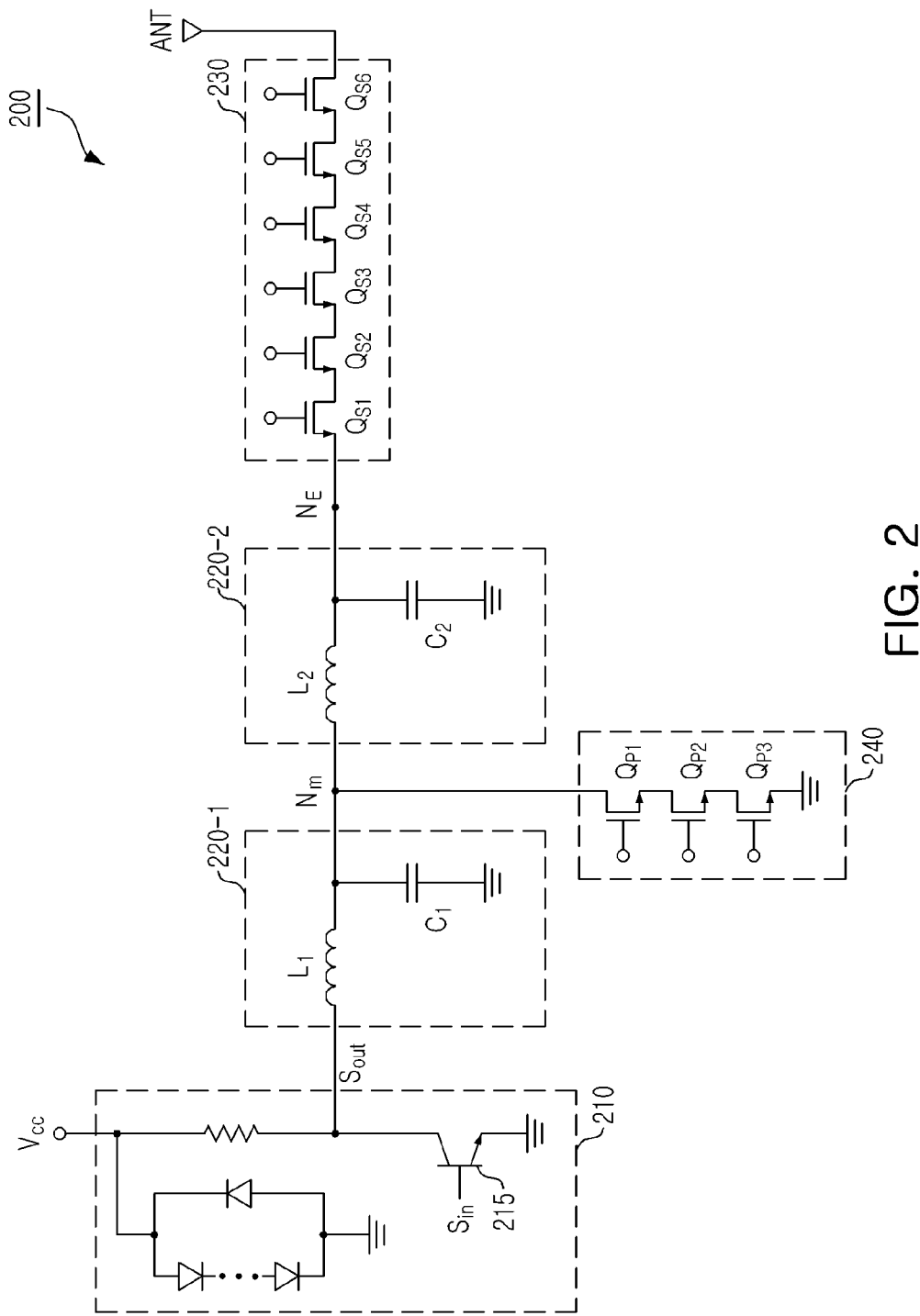
FIG. 2 is a circuit diagram showing an example of the front end module according to the embodiment of the present invention.

FIG. 2 is a circuit diagram showing one example of the front end module according to the embodiment of the present invention.

Referring to FIG. 2, the front end module according to the present embodiment may include an amplification circuit unit 210, a first matching circuit 220-1, a second matching circuit 220-2, a series switch circuit unit 230, and a parallel switch circuit unit 240. The series switch circuit unit 230 may be connected to an antenna ANT to transmit an output signal $S_{out}$, which is outputted from the amplification circuit unit 210 in a signal transmission mode, to the antenna ANT.

As described above, the amplification circuit unit 210 may include an amplification device 215 amplifying an input signal Sin, and the amplification device 215 may be configured of a transistor such as a bipolar junction transistor (BJT) or the like. In the case in which the BJT is used as the amplification device 215, the input signal $S_{in}$ may be applied to a base terminal of the BJT and the output signal $S_{out}$ may be transmitted through a collector terminal. A power voltage Vcc necessary for an amplification operation is applied to the collector terminal of the BJT.

In the operation of the amplification circuit unit 210, the impedance at the output terminal of the amplification device 215 may be several ohms in order to obtain a relatively maximum power of output. Whereas, since an input impedance of a switch device included in the series switch circuit unit 230 may be several tens of ohms, for example, 50 ohms, matching circuits 220-1 and 220-2 are needed for impedance conversion. Herein, the amount of matching circuits 220-1 and 220-2 may be plural. In the present embodiment, it is assumed that two matching circuits 220-1 and 220-2 are applied, but the present invention is not necessarily limited thereto.

The respective matching circuits 220-1 and 220-2 may include inductors L1 and L2 as inductive elements and capacitors C1 and C2 as capacitive elements, respectively. The matching circuits 220-1 and 220-2 may have low pass filters configured of inductive elements L1 and L2 connected in series to the output signal $S_{out}$ and capacitive elements C1 and C2 connected in parallel with the output signal Sout. Every time the output signal $S_{out}$ passes through the respective matching circuits 220-1 and 220-2, the swing width of the output signal $S_{out}$ may increase due to impedance conversion. In a signal transmission mode in which the series switch circuit unit 230 is turned on and the parallel switch circuit unit 240 is turned off, the output signal $S_{out}$ having a relatively large swing width may flow into the parallel switch circuit unit 240 as a leakage signal.

Therefore, in the present embodiment, in order to significantly reduce the swing width of the leakage signal flowing into the parallel switch circuit unit 240 in the signal transmission mode, the parallel switch circuit unit 240 is connected to a middle node $N_M$ through which the first matching circuit 220-1 and the second matching circuit 220-2 are connected to each other. Since a maximum level and a swing width of the leakage signal flowing into the parallel switch circuit unit 240 is relatively small, the parallel switch circuit unit 240 may be configured of a relatively less number of switch devices, as compared with the series switch circuit unit 230. Referring to FIG. 2, the parallel switch circuit unit 240 may include only three switch devices $Q_{P1}$~$Q_{P3}$, as compared with the series switch circuit unit 230 including six switch devices $Q_{S1}$~$Q_{S6}$. This is an example, but the series and parallel switch circuit units 230 and 240 may also be configured of a different number of switch devices from those shown in FIG. 2.

The series switch circuit unit 230 is connected between an end node $N_E$ of the second matching circuit 220-2 and the antenna ANT. Also, the series switch circuit unit 230 is configured such that drains and sources of a plurality of switch devices $Q_{S1}$~$Q_{S6}$ included in the series switch circuit unit 230 are connected to one another, similarly to the parallel switch circuit unit 240 having a stack structure in which drains and sources of MOSFETs are connected to one another. When a turn-on signal is applied to gates of the plurality of switch devices $Q_{S1}$~$Q_{S6}$ included in the series switch circuit unit 230, the front end module 200 may operate in a signal transmission mode.

The parallel switch circuit unit 240 is connected in parallel with a route through which the output signal $S_{out}$ of the amplification circuit unit 210 is transmitted to the antenna ANT, and thus operates as a shunt switch. That is, when the series switch circuit unit 230 is turned on in the signal transmission mode, the parallel switch circuit unit 240 is turned off, and thus only the output signal $S_{out}$ of the amplification circuit unit 210 is certainly transmitted to the antenna ANT. In particularly, assuming that a plurality of amplification circuit units 210 are connected to one antenna ANT in a mobile terminal device using a plurality of communication modes, the parallel switch circuit units 240 is selectively turned on or turned off depending on the respective communication modes, thereby significantly reducing interference between the communication modes.

Figure 3:
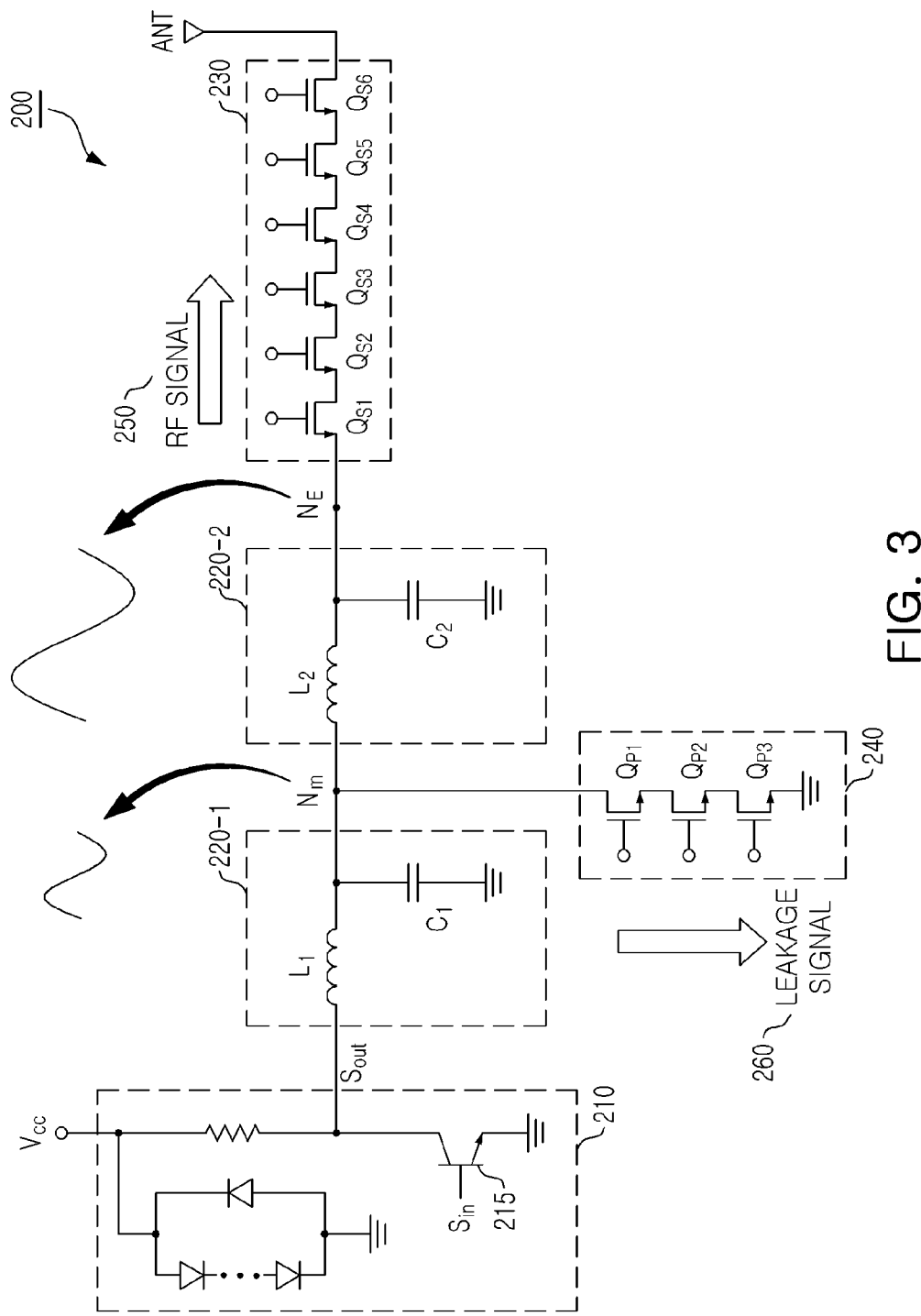
FIG. 3 is a circuit diagram for explaining an operation method of the front end module according to the embodiment of the present invention.

FIG. 3 is a circuit diagram for explaining an operation method of the front end module according to the embodiment of the present invention.

Referring to FIG. 3, in the present embodiment, it is assumed that a front end module 200 operates in a signal transmission mode. The amplification circuit unit 210 includes a BJT as the amplification device 215. An input signal $S_{in}$ is applied to a base terminal of the BJT to output an output signal $S_{out}$ through a collector terminal thereof.

A plurality of matching circuits 220-1 and 220-2 are connected to an output terminal of the amplification circuit unit 210. The first matching circuit 220-1 and the second matching circuit 220-2 may include a low pass filter structure having inductive elements, inductors L1 and L2 and capacitive elements, capacitors C1 and C2, respectively. A parallel switch circuit unit 240 may be connected between a middle node $N_M$, through which the first matching circuit 220-1 and the second matching circuit 220-2 are connected to each other, and a ground terminal, and a series switch circuit unit 230 may be connected between an end node $N_E$ of the plurality of matching circuits 220-1 and 220-2 and an antenna ANT.

In the case of operation in a signal transmission mode, a plurality of switch devices $Q_{S1}$~$Q_{S6}$ included in the series switch circuit unit 230 are all turned on. Therefore, an RF signal 250 is transmitted to the antenna ANT through the series switch circuit unit 230. Here, since the switch devices $Q_{S1}$~$Q_{S6}$ included in the series switch circuit unit 230 are turned on, little voltage is applied to drain-source terminals of a MOSFET applied as each of the switch devices $Q_{S1}$~$Q_{S6}$. Therefore, linearity does not matter in the switch devices $Q_{S1}$~$Q_{S6}$ included in the series switch circuit unit 230.

Whereas, switch devices $Q_{P1}$~$Q_{P3}$ included in the parallel switch circuit unit 240 are all turned off in a signal transmission mode. However, a portion of the RF signal passing through the first matching circuit 220-1 flows into the parallel switch circuit unit 240, as a leakage signal 260, and the leakage signal 260 generates a predetermined voltage between drain and source terminals of the turned-off switch devices $Q_{P1}$~$Q_{P3}$. Here, in the case in which a voltage between the drain and source terminals is higher than a maximum voltage at which one switch device may withstand, the switch device may be broken. Therefore, the parallel switch circuit unit 240 may have a stack structure so that the leakage signal 260 is divisionally applied to several switch devices $Q_{P1} \sim Q_{P3}$.

In addition, in order to prevent the deterioration of linearity and breakage of switch devices, according to the embodiment of the present invention, the parallel switch circuit unit 240 is connected to a middle node $N_M$ between the first matching circuit 220-1 and the second matching circuit 220-2, not to an end node $N_E$ between the second matching circuit 220-2 and the series switch circuit unit 230. Therefore, here, a portion of an RF signal having relatively low level and swing width flows into the parallel switch circuit unit 240, as compared with a case in which the parallel switch circuit unit 240 is connected to the end node NE.

Eventually, in the foregoing configuration, the level of the leakage signal 260 flowing into the parallel switch circuit unit 240 may be decreased. Therefore, since the amount of switch devices $Q_{P1} \sim Q_{P3}$ included in the parallel switch circuit unit 240 is decreased or the parallel switch circuit unit 240 is configured of the switch devices $Q_{P1} \sim Q_{P3}$ having a relatively low limit voltage, the configuration costs of the entire circuit may be lowered. In addition, in the case in which the amount of switch devices $Q_{P1} \sim Q_{P3}$ is decreased, the size of the chip may be decreased in the front end module implemented by a single chip.

Like FIG. 2, FIG. 3 also shows that the series switch circuit unit 230 includes six switch devices $Q_{S1} \sim Q_{S6}$ and the parallel switch circuit unit 240 includes three switch devices $Q_{P1} \sim Q_{P3}$, but this is provided by way of an example. In addition, the amount of matching circuits 220-1 and 220-2 connected may be greater than two. When an embodiment of the present invention is applied to a circuit configuration different from those of the embodiment shown in FIGS. 2 and 3, any case, in which the parallel switch circuit unit 240 is connected to any one of nodes through which the plurality of matching circuits are connected to one another, may be construed as being included in the embodiment of the present invention.

In addition, regardless of the amount of switch devices included in each of the series switch circuit unit 230 and the parallel switch circuit unit 240, a MOSFET having a relatively low limit voltage may be applied to the switch devices included in the parallel switch circuit unit 240. That is, it will be understood that the amount of switch devices included in the parallel switch circuit unit 240 is not always lower than the amount of switch devices included in the series switch circuit unit 230 when the parallel switch circuit unit 240 is connected to the node between the plurality of matching circuits, but this may relax the restrictions on circuit configuration in designing the front end module. Surely, in the case in which the series switch circuit unit 230 and the parallel switch circuit unit 240 are implemented by MOSFETs having substantially identical or similar characteristics, the amount of switch devices included in the parallel switch circuit unit 240 may be decreased, and thus the chip size may be decreased and the manufacturing costs thereof may be reduced.

As set forth above, according to the embodiments of the present invention, the multistage matching circuit unit is connected to an output node of the amplification circuit unit and the parallel switch circuit unit is connected to a middle node between the multistage matching circuit units. Therefore, when the parallel switch circuit unit connected between the end node of the multistage matching circuit unit and the antenna is turned on, the swing width of the voltage applied to the switch devices included in the parallel switch circuit unit may be reduced, and thus the amount of switch devices included in the parallel switch circuit unit may be decreased, thereby preventing an increase in a size of the chip constituting the front end module and reducing manufacturing costs.

While the present invention has been shown and described in connection with the embodiments, it will be apparent to those skilled in the art that modifications and variations can be made without departing from the spirit and scope of the invention as defined by the appended claims.

What is claimed is:

1. A front end module, comprising:
an amplification circuit unit amplifying a signal;
a multistage matching circuit unit connected to an output terminal of the amplification circuit unit; and
a switch circuit unit connected to the multistage matching circuit unit,
wherein the switch circuit unit includes a series switch circuit and a parallel switch circuit, and the parallel switch circuit being connected to a node between a plurality of matching circuits included in the multistage matching circuit unit in which a radio frequency (RF) signal has a lower voltage level than a voltage level in an end terminal of the plurality of matching circuits, and
wherein, when the series switch circuit is turned on, the switch circuit unit turns off the parallel switch circuit to transmit the signal amplified by the amplification circuit unit to the output terminal.

2. The front end module of claim 1, wherein the series switch circuit and the parallel switch circuit each include a plurality of switch devices.

3. The front end module of claim 2, wherein the number of switch devices included in the series switch circuit is greater than the number of switch devices included in the parallel switch circuit.

4. The front end module of claim 2, wherein the plurality of switch devices included in the parallel switch circuit are connected to one another to form a stack structure.

5. A front end module, comprising:
an amplification device having an input terminal and an output terminal;
a plurality of matching circuits connected to an output terminal of the amplification device;
a plurality of first switch devices connected in parallel to a node between the plurality of matching circuits in which an RF signal has a lower voltage level than a voltage level in an end terminal of the plurality of matching circuits; and
a plurality of second switch devices connected in series between the end terminal of the plurality of matching circuits and an antenna,
wherein, when the plurality of second switch devices are turned on, the plurality of first switch devices are turned off, and
the number of the plurality of the first switch devices is lower than the number of the plurality of the second switch devices.

6. The front end module of claim 5, wherein the plurality of matching circuits each include at least one capacitive element and at least one inductive element.

7. The front end module of claim 5, wherein the plurality of first switch devices are connected in series between a node between the plurality of matching circuit and a ground terminal, and
wherein the plurality of second switch devices are connected in series between an end node of the plurality of matching circuits and the antenna.

8. The front end module of claim 5, wherein the plurality of first switch devices have a stack structure in which a leakage voltage transmitted to the plurality of first switch devices is significantly reduced, in a signal transmission mode in which the plurality of second switch devices are turned on to transmit an output signal of the amplification device to the antenna.

9. The front end module of claim 5, wherein the plurality of first switch devices and the plurality of second switch devices include a plurality of metal oxide semiconductor field effect transistors (MOSFETs), respectively.

* * * * *